(12) United States Patent
Takeuchi et al.

(10) Patent No.: US 6,780,549 B2
(45) Date of Patent: Aug. 24, 2004

(54) PHOTO-OR HEAT-CURABLE RESIN COMPOSITION AND MULTILAYER PRINTED WIRING BOARD

(75) Inventors: Masahiko Takeuchi, Kisarazu (JP); Kazuhiko Mizuuchi, Kisarazu (JP); Hironobu Kawasato, Tokyo (JP)

(73) Assignee: Nippon Steel Chemical Co., Ltd., Tokyo (JP)

( * ) Notice: Subject to any disclaimer, the term of this patent is extended or adjusted under 35 U.S.C. 154(b) by 237 days.

(21) Appl. No.: 09/933,946

(22) Filed: Aug. 22, 2001

(65) Prior Publication Data

US 2002/0051942 A1 May 2, 2002

(30) Foreign Application Priority Data

Aug. 22, 2000 (JP) ........................................ 2000-251055

(51) Int. Cl.$^7$ .............................................. G03F 7/075
(52) U.S. Cl. .................. 430/18; 430/280.1; 430/285.1; 430/311; 522/77; 524/493
(58) Field of Search ........................ 430/18, 311, 285.1, 430/280.1; 522/77; 524/493

(56) References Cited

U.S. PATENT DOCUMENTS

| | | | | |
|---|---|---|---|---|
| 4,511,757 A | * | 4/1985 | Ors et al. | 174/258 |
| 4,786,579 A | * | 11/1988 | Tazawa et al. | 430/280.1 |
| 4,970,135 A | * | 11/1990 | Kushi et al. | 430/280.1 |
| 5,084,320 A | * | 1/1992 | Barito et al. | 428/69 |
| 5,141,822 A | * | 8/1992 | Matsuo et al. | 428/623 |
| 5,217,847 A | * | 6/1993 | Varnell | 430/288.1 |
| 5,260,064 A | * | 11/1993 | Nakagawa et al. | 424/448 |
| 5,700,607 A | * | 12/1997 | Rath et al. | 430/280.1 |
| 5,709,975 A | * | 1/1998 | Yoerger et al. | 430/111.33 |
| 6,066,889 A | * | 5/2000 | Jones et al. | 257/698 |

FOREIGN PATENT DOCUMENTS

| | | | | |
|---|---|---|---|---|
| EP | 717318 A1 | * | 6/1996 | G03F/7/004 |
| EP | 0 933681 A1 | * | 8/1999 | G03F/7/022 |
| WO | WO 9950369 A1 | * | 10/1999 | C09J/171/00 |

OTHER PUBLICATIONS

Kirk–Othmer Encyclopedia of chemical Technology, "Fillers" by James S Falcon, John Wiley & Sons, 1994, Abstract, beginning of article, 2.Properties, 3. Filled Polymer systems, 14 pages from sss.mrw.interscience.wiley.com/kirk/artiles/fillfac.ao1.*

"Thixotropy" from The American Heritage Dictionary of the English Language: Fourth Edition. 2000, Hougton Mifflin Company, one page on line, www.barleby.com.*

"Thisotrope", What You Need to Know About, Composities/Plastics, website Wysiwyg://2/http://plastics.abou.com/library/glossary/t/bldef–t5572, 3 pages, Copyright 2003 About.inc.*

"fill–er" from American Heritage dictionary of the English language, Second College edition, p. 503, Houghton Mifflin Company, Boston, MA 1982.*

AERISIL Datasheet, three pages, , Aerosil 380, degussa Ag, from website htp://x:x@www2.sivento.de/sivento/sili. . ilica$_{13}$ datasheet.aps?id+512&definito and www.aerosil-com.*

Kirk–Othmer Encyclopedia of Chemical Technology, "Silcia, Amorphous Silica, 5. Silica Sols and colloidal Silica" by Waddell, John Wiley & sones, 1997.*

Glinka et al , Applied Physics Letters, vol. 75, No. 6, Aug. 9, 1999, pp. 778–780.*

Patent Abstract Of Japan; 09–148748 (Jun. 6, 1997).

Patent Abstract Of Japan; 10–242650 (Sep. 11, 1998).

* cited by examiner

*Primary Examiner*—Cynthia Hamilton
(74) *Attorney, Agent, or Firm*—Birch, Stewart, Kolasch & Birch, LLP

(57) ABSTRACT

This invention relates to a photo- or heat-curable resin composition which yields a cured product with minimal cracking and high reliability. The resin composition of this invention comprises 100 parts by weight of the resin-forming component containing a photo- or heat-polymerizable unsaturated compound and 0.01–5 parts by weight of an inorganic filler such as silica sol with its average particle diameter controlled in the range 5 nm–0.5 μm. The composition exhibits high heat resistance and good microfabrication quality and is useful as a peripheral material of electronic parts such as semiconductor devices by the build-up process, for example, as a material for forming insulation layers in multilayer printed wiring boards.

3 Claims, No Drawings

PHOTO-OR HEAT-CURABLE RESIN COMPOSITION AND MULTILAYER PRINTED WIRING BOARD

FIELD OF THE INVENTION

This invention relates to a photo- or heat-curable resin composition suitable for insulating a printed wiring board and to a multilayer printed wiring board containing an insulating resin layer formed from said photo- or heat-curable resin composition.

BACKGROUND OF THE INVENTION

In recent years, the on-going miniaturization of electronic instruments has led to the development of a multi-level system for printed wiring in order to attain a higher degree of integration of electronic devices and the so-called build-up process which is put into practice by forming an insulating layer and a conductive layer alternately and laminating them together has come into frequent use. And here, high reliability is demanded for the resin materials to be used for insulation. Moreover, it is often the case that a printed wiring board is covered with an insulating layer to protect the surface or the mounted chips.

In the use of insulating materials based on organic resins in multilayer printed wiring boards, however, the organic resins differ greatly in the thermal expansion coefficient from the active parts such as semiconductor devices and the passive parts such as capacitative elements and resistors and, still more, from substrates such as sintered alumina materials, epoxy resins on glass cloth formed by impregnating glass cloth woven from glass fibers with epoxy resins, and silicon wafers; in case a large thermal stress results from the difference in the thermal expansion coefficient between the organic resins and other components, the stress causes cracking and splitting apart of semiconductor devices, capacitative elements, and conductive wirings and the affected devices cease to function normally.

Now, a practice of incorporating fillers in resin insulating materials is known from old and the incorporation of fillers in the resin components constituting the resin insulating layers of multilayer wiring boards is also known. In JP 09-148748 (1997)A1, for example, a filler is used for roughening the surface of a resin insulator in order to improve the adhesion of resin insulator to wiring; however, the filler here is used not only for the object different from that of this invention but also at a high rate of incorporation on the order of 5–50% by weight and the practice as described here cannot manifest a sufficient effect in the thermal shock test which is a typical reliability test.

On the other hand, JP 10-242650 (1998)A1 has an object of reducing cracking in the thermal shock test and attempts to realize this by reducing the thermal expansion coefficient of an insulating material by adding a filler. In this case again, the content of the filler is high on the order of 10–95% by weight and fine patterns are difficult to obtain when the resin insulating layer is processed.

Wet plating and dry plating are known in the manufacture of multilayer printed wiring boards by a process such as the build-up process; the former requires the uneven condition in practice which makes its use difficult in a high frequency region and the latter is gaining favor.

Accordingly, an object of this invention is to provide a photo- or heat-curable resin composition which cures into a film of high reliability as tested by the thermal shock test which is a typical test for reliability of substrates as a resin composition for forming a resin insulating layer in a wiring board. Another object of this invention is to provide a resin composition which can be processed to yield fine patterns. A further object of this invention is to provide a cured resin which is heat- and solvent-resistant and suitable for use as an interlayer insulating layer in a multilayer printed wiring board.

SUMMARY OF THE INVENTION

The present inventors have conducted extensive studies to solve the aforementioned problems, found that incorporating in a resin a fine filler with its particle diameter controlled in the specified range contributes to produce an effect of preventing the formation of minute cracks when the resin is used as an insulating layer in a wiring board, and completed this invention.

This invention relates to a photo- or heat-curable resin composition which is intended for forming an insulating layer in a multilayer printed wiring board and comprises 0.1–5 parts by weight of an inorganic filler with its average particle diameter controlled in the range 5 nm-0.5 μm per 100 parts by weight of the resin-forming component.

Moreover, this invention relates to the aforementioned photo- or heat-curable resin composition comprising (A) 100 parts by weight of a photopolymerizable unsaturated compound represented by the following general formula (1)

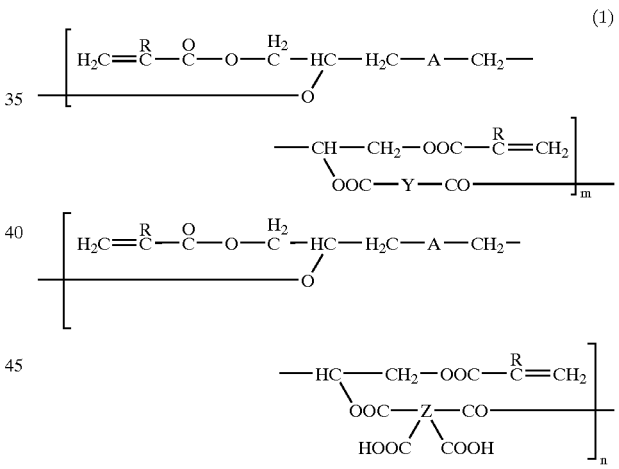

wherein R is a hydrogen atom or a methyl group, A is a group represented by the formula (2)

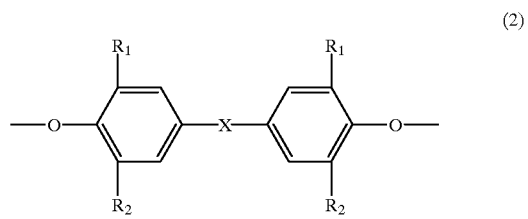

(wherein $R_1$ and $R_2$ are hydrogen, an alkyl group with 1–5 carbon atoms, or a halogen) and X is —CO—, —$SO_2$—, —$C(CF_3)_2$—, —$Si(CH_3)_2$—, —$CH_2$—, —$C(CH_3)_2$—, —O—, —S—,

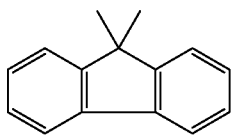

or a single bond, Y and Z are respectively the residue of a polycarboxylic acid or its acid anhydride, and m and n are the number of structural units at a molar ratio (m/n) 0/100–100/0, (B) 0–50 parts by weight of a compound containing an epoxy group, and (C) 0–10 parts by weight of a photopolymerization initiator or sensitizer.

Still more, this invention relates to the aforementioned photo- or heat-curable resin composition comprising silica sol as an inorganic filler. Furthermore, this invention relates to a multilayer printed wiring board comprising a cured product of the aforementioned photo- or heat-curable resin composition as an insulating layer.

DETAILED DESCRIPTION OF THE INVENTION

This invention will be described in detail below.

A photo- or heat-curable resin composition of this invention comprises 100 parts by weight of the resin-forming component and 0.01–5 parts by weight of a filler with its average particle controlled in the range 5 nm–0.5 $\mu$m. The resin-forming component refers to a component which cures into a resin and is computed as the sum of a resin and a monomer (including a curing agent). A photo- or heat-curable resin composition of this invention may comprise an initiator, a solvent and other additives in addition to the resin-forming component and filler.

A photo- or heat-curable resin composition of this invention preferably comprises a photopolymerizable unsaturated compound, a compound containing an epoxy group, a photopolymerization initiator or sensitizer, and a filler as essential components. More preferably, the composition comprises a photopolymerizable unsaturated compound represented by the aforementioned general formula (1) or the component (A) and a compound containing an epoxy group or the component (B) as the resin-forming component, a photopolymerization initiator or sensitizer or the component (C) as the initiator component, and an inorganic filler with its average particle diameter controlled in the range 5 nm–0.5 $\mu$m or the component (D) as the filler component. The incorporation of a photopolymerizable unsaturated compound other than the component (A) or the component (F) may also be beneficial.

A compound which contains an ethylenic unsaturated bond and is liquid at normal temperature can generally be cited as a photopolymerizable unsaturated compound, but what is preferred here is a photopolymerizable unsaturated compound represented by the aforementioned general formula (1) or the component (A). The component (A) can be prepared, for example, by epoxidizing a bisphenol which contains X at its center, treating the epoxidized bisphenol with (meth)acrylic acid, and then treating the resulting (meth)acrylate with the anhydride of a polybasic acid. The procedure for preparing the component (A) is not limited to the aforementioned; for convenience' sake, however, the aforementioned procedure will be explained below.

Concrete examples of useful bisphenols are as follows: bis(4-hydroxyphenyl) ketone, bis(4-hydroxy-3,5-dimethylphenyl) ketone and bis(4-hydroxy-3,5-dichlorophenyl) ketone for X=—CO— in the general formula (1) and (2); bis(4-hydroxyphenyl) sulfone, bis(4-hydroxy-3,5-dimethylphenyl) sulfone and bis(4-hydroxy-3,5-dichlorophenyl) sulfone for X=—SO$_2$—; bis(4-hydroxyphenyl)hexafluoropropane, bis(4-hydroxy-3,5-dimethylphenyl)hexafluoropropane and bis(4-hydroxy-3,5-dichlorophenyl)hexafluoropropane for X=—C(CF$_3$)$_2$—; bis(4-hydroxyphenyl)dimethylsilane, bis(4-hydroxy-3,5-dimethylphenyl)simethylsilane and bis(4-hydroxy-3,5-dichlorophenyl)dimethylsilane for X=—Si(CH$_3$)$_2$—; bis(4-hydroxyphenyl)methane, bis(4-hydroxy-3,5-dibromophenyl)methane and bis(4-hydroxy-3,5-dichlorophenyl)methane for X=—CH$_2$—; 2,2-bis(4-hydroxyphenyl)propane, 2,2-bis(4-hydroxy-3,5-dimethylphenyl)propane and 2,2-bis(4-hydroxy-3,5-dichlorophenyl)propane for X=—C(CH$_3$)$_2$—; bis(4-hydroxyphenyl) ether, bis(4-hydroxy-3,5-dimethylphenyl) ether and bis(4-hydroxy-3,5-dichlorophenyl) ether for X=—O—; bis(4-hydroxyphenyl) sulfide, bis(4-hydroxy-3,5-dimethylphenyl) sulfide and bis(4-hydroxy-3,5-dichlorophenyl) sulfide for X=—S—; 9,9-bis(4-hydroxyphenyl)fluorene, 9,9-bis(4-hydroxy-3-methylphenyl)fluorene, 9,9-bis(4-hydroxy-3-chlorophenyl)fluorene, 9,9-bis(4-hydroxy-3-bromophenyl)fluorene, 9,9-bis(4-hydroxy-3-fluorophenyl)fluorene, 9,9-bis(4-hydroxy-3-methoxyphenyl)fluorene, 9,9-bis(4-hydroxy-3,5-dimethylphenyl)fluorene, 9,9-bis(4-hydroxy-3,5-dichlorophenyl)fluorene and 9,9-bis(4-hydroxy-3,5-dibromophenyl)fluorene for X=fluorene-9-ylidene; and 4,4'-dihydroxybiphenyl and 3,3'-dihydroxybiphenyl for X=direct bond.

The epoxidation of the aforementioned bisphenols can be effected in the usual manner. For example, a bisphenol is dissolved in excess epichlorohydrin and allowed to react in the presence of an alkali metal hydroxide such as sodium hydroxide and potassium hydroxide at 50–150° C., preferably at 60–120° C., for 1–10 hours.

The reaction of an epoxy compound and (meth)acrylic acid is effected by treating each 1 mole of the epoxy group in the epoxy compound with 0.8–1.5 moles, preferably 0.9–1.1 moles, of (meth)acrylic acid. In this reaction, methyl ethyl ketone or Methyl Cellosolve acetate may be used as a diluent. Also, a catalyst such as triethylamine, benzyldimethylamine, methyltriethylammonium chloride and triphenylphosphine may be used to accelerate the reaction. The catalyst is used in an amount corresponding normally to 0.1–10% by weight, preferably to 0.3–5% by weight, of the reactant mixture, the reaction temperature is kept at 60–150° C., preferably at 80–120° C., and the reaction time is 5–60 hours, preferably 10–50 hours.

The groups Y and Z in the aforementioned general formula (1) respectively designate the residue of a polycarboxylic acid or its acid anhydride and, preferably, Y is the residue of an acid anhydride and Z is the residue of an acid dianhydride. Polycarboxylic acids or their acid anhydrides that can form such residues as Y and Z include maleic acid, succinic acid, itaconic acid, phthalic acid, tetrahydrophthalic acid, hexahydrophthalic acid, methyl-endomethylenetetrahydrophthalic acid, chlorendic acid, methyltetrahydrophthalic acid, pyromellitic acid, benzophenonetetracarboxylic acid, biphenyltetracarboxylic acid, and diphenyl ether tetracarboxylic acid and their anhydrides. They can be used singly or as a mixture of two kinds or more.

The reaction of an epoxy (meth)acrylate with a polycarboxylic acid (or its acid anhydride) can be effected in a known manner. A polycarboxylic acid or its acid anhydride to be used here is preferably a tribasic or higher carboxylic acid or its anhydride or a mixture of the two so that the resulting photopolymerizable unsaturated compound (it may be in the form of a resin) represented by the general formula (1) exhibits an acid value of 10 mg KOH/g or more and manifests sufficient solubility in alkali.

The component (A) represented by the aforementioned general formula (1) is not necessarily limited to the aforementioned compounds and it may be used as a mixture of two kinds or more. Moreover, a monoanhydride and a dianhydride of polycarboxylic acids are used simultaneously at a molar monohydride/dianhydride ratio 0/100–100/0, preferably 1/99–90/10. Moreover, it is preferable that the inherent viscosity of a solution of 0.5 g of the component (A) in 100 ml of N-methylpyrrolidone at 30° C. is 0.1 dl or more.

A compound containing an epoxy group or the component (B) is used for the purpose of improving adhesion and alkali resistance and examples of such a compound include epoxy resins such as phenol novolak epoxy resins, cresol novolak epoxy resins, bisphenol A epoxy resins, bisphenol F epoxy resins, bisphenol S epoxy resins, biphenyl epoxy resins, and alicyclic epoxy resins and compounds containing at least one epoxy group such as phenyl glycidyl ether, p-butylphenyl glycidyl ether, triglycidyl isocyanurate, allyl glycidyl ether and glycidyl methacrylate.

It is permissible to use a curing agent for epoxy compounds together with the component (B), but there is no need of that in case a compound containing a carboxyl group such as the component (A) is present.

In addition to the aforementioned resin-forming component consisting of the component (A), component (B) and curing agent, it is possible to incorporate another resin or monomer exhibiting a property of undergoing polymerization or condensation as the component (F) in a photo- or heat-curable resin composition of this invention. In case the matrix resin component is soluble in alkali, it is advisable to select a resin or monomer for the component (F) and incorporate it so that this property of alkali solubility is maintained. By maintaining the alkali solubility, it becomes possible to form fine patterns by alkali development in processing an insulating layer of the substrate.

Resins or monomers suitable for incorporation with the alkali solubility kept intact include alkali-soluble resins whose skeleton alone is modified or other (meth)acrylates.

The (meth)acrylates here include the following: hydroxyl-containing (meth)acrylate such as hydroxyethyl (meth)acrylate, hydroxypropyl (meth)acrylate, 2-hydroxyethylhexyl (meth)acrylate, polyethylene glycol mono(meth)acrylate, polypropylene glycol mono(meth)acrylate, butanediol mono(meth)acrylate, and chlorohydroxypropyl (meth)acrylate; aliphatic (meth)acrylates such as allyl (meth)acrylate, butoxyethyl (meth)acrylate, triethylene glycol butyl ether (meth)acrylate, t-butylaminoethyl (meth)acrylate, caprolactone (meth)acrylate, butyl (meth)acrylate, hexyl (meth)acrylate, cyanoethyl (meth)acrylate, dimethylaminoethyl (meth)acrylate, diethylamino (meth)acrylate, ethoxyethyl (meth)acrylate, ethylhexyl (meth)acrylate, isodecyl (meth)acrylate, isooctyl (meth)acrylate, lauryl (meth)acrylate, octyl (meth)acrylate, stearyl (meth)acrylate, succinic acid (meth)acrylate, methacryloyloxypropyltrimethoxysilane, methoxyethyl (meth)acrylate, cyclodecatrienyl (meth)acrylate, glycerol (meth)acrylate, glycidyl (meth)acrylate, isocyanatoethyl (meth)acrylate, heptadecafluorooctyl (meth)acrylate, octafluoropentyl (meth)acrylate, tetrafluoropropyl (meth) acrylate, trifluoroethyl (meth)acrylate, and dibromopropyl (meth)acrylate; alicyclic-modified (meth)acrylates such as cyclohexyl (meth)acrylate, dicyclopentanyl (meth)acrylate, dicyclopentenyl (meth)acrylate, isobornyl (meth)acrylate, tetrahydrofurfuryl (meth)acrylate, and morpholino (meth) acrylate; aromatic (meth)acrylates such as phenoxyethyl (meth)acrylate, phenoxyhydroxypropyl (meth)acrylate, polypropylene glycol nonylphenyl ether (meth)acrylate, phenyl (meth)acrylate, phthalic acid (meth)acrylate, and benzyl (meth)acrylate; phosphorus-containing (meth) acrylates such as phenoxylated phosphoric acid (meth) acrylate, phosphoric acid (meth)acrylate, butoxylated phosphoric acid (meth)acrylate, and octoxylated phosphoric acid (meth)acrylate; and water-soluble (meth)acrylates such as sodium sulfonate (meth)acrylate.

The monomers in question also include the following bifunctional compounds: ethylene glycol di(meth)acrylate, diethylene glycol di(meth)acrylate, hexanediol di(meth) acrylate, di(meth)acrylates of long-chain aliphatic diols, neopentyl glycol di(meth)acrylate, hydroxypivalic acid neopentyl glycol di(meth)acrylate, stearic acid-modified pentaerythritol di(meth)acrylate, propylene glycol di(meth) acrylate, glycerol di(meth)acrylate, triethylene glycol di(meth)acrylate, tetraethylene glycol di(meth)acrylate, triethylene glycol divinyl ether, tetramethylene glycol di(meth)acrylate, butylene glycol di(meth)acrylate, dicyclopentanyl di(meth)acrylate, polyethylene glycol di(meth) acrylate, polypropylene glycol di(meth)acrylate, triglycerol di(meth)acrylate, neopentyl glycol-modified trimethylolpropane di(meth)acrylate, allylated cyclohexyl di(meth) acrylate, methoxylated cyclohexyl di(meth)acrylate, acrylic group-substituted isocyanurate, bis(acryloyloxyneopentyl) adipate, bisphenol A di(meth)acrylate, tetrabromobisphenol A di(meth)acrylate, bisphenol S di(meth)acrylate, butanediol di(meth)acrylate, phthalic acid di(meth)acrylate, phosphoric acid di(meth)acrylate, zinc di(meth)acrylate, divinylbenzene, and divinyl ether.

Furthermore, the monomers in question include the following trifunctional or higher compounds: trimethylolpropane tri(meth)acrylate, trimethylolethane tri(meth)acrylate, glycerol tri(meth)acrylate, pentaerythritol tri(meth)acrylate, alkyl-modified dipentaerythritol tri(meth)acrylate, phosphoric acid tri(meth)acrylate, tris(acryloyloxyethyl) isocyanurate, tris(methacryloyloxyethyl) isocyanurate, pentaerythritol tetra(meth)acrylate, dipentaerythritol tetra(meth) acrylate, ditrimethylolpropane tetraacrylate, alkyl-modified dipentaerythritol tetra(meth)acrylate, dipentaerythritol penta (meth)acrylate, dipentaerythritol hexa(meth)acrylate, alkyl-modified dipentaerythritol penta(meth)acrylate, urethane tri (meth)acrylate, ester tri(meth)acrylate, urethane hexa(meth) acrylate, ester hexa(meth)acrylate, trivinyl ether and hexavinyl ether.

Modifications by caprolactone, propylene oxide or ethylene oxide of the aforementioned monofunctional, difunctional, trifunctional and higher compounds containing ethylenic unsaturated groups can also be used in the same manner. Other polymerizable monomers, for example, monofunctional vinyl compounds like vinyl acetate, vinylcaprolactam, vinylpyrrolidone, and styrene can be used if necessary. Resins such as polyesters and polyvinyl resins can also be used if necessary. In the use of the aforementioned monofunctional, difunctional, trifunctional and higher compounds, modifications and resins, not only one kind can be used alone but also two kinds or more can be used simultaneously.

In the case in which good photo-curability or high sensitivity is demanded in addition to alkali solubility for a resin composition of this invention, the resin or monomer to be incorporated contains preferably two or more polymerizable double bonds (binfunctional or higher), more preferably three or more polymerizable double bonds (trifunctional or higher), in the molecule.

As for the proportion of the aforementioned resin and monomer to be incorporated in the case in which good photo-curability is required, an insufficient incorporation of, for example, trifunctional or higher acrylates does not cause photo-curing to proceed sufficiently thereby causing the exposed regions to dissolve out on occasion; on the other hand, too much incorporation generates the cases in which even the unexposed region cannot be developed and there is the possibility of the tack-free property being lost depending upon the degree of polymerization and the structure of acid anhydrides.

The resin-forming component of a photo- or heat-curable resin composition of this invention consists of the component (A), the component (B), a curing agent and other resin or monomer and the resin-forming component comprises at least one kind of them, preferably the component (A) and another kind, more preferably the component (A), the component (B), and other resin or monomer composed essentially of a trifunctional or higher resin or monomer. The component (A) suitably accounts for 30–80% by weight of the resin-forming component, the component (B) 10–50% by weight, and other resin or monomer 10–40% by weight. Other resin or monomer is preferably a polyfunctional acrylate containing two or more (meth)acrylate groups. The proportions of the three are 100 parts by weight of the component (A), 0–50 parts by weight of the component (B), and 0–100 parts of other resin or monomer.

An inorganic filler with its average particle diameter controlled in the range 5 nm–0.5 $\mu$m is used in a photo- or heat-curable resin composition of this invention. The filler is not restricted to any particular kind as long as its average particle diameter is in this range and it can be selected suitably in consideration of such factors as its compatibility with the matrix-forming resin component and dispersibility. Silica sol is more preferable and its dispersion in an organic solvent is more preferable, the latter being commercially available.

The average particle diameter of a filler useful for this invention varies more or less with the end use of the resin composition, but it needs to be in the range 5 nm–0.5 $\mu$m. In case the composition is intended for resin insulation in wiring boards, the average particle diameter is preferably in the range 7 nm–0.3 $\mu$m, more preferably 10–100 nm, An average particle diameter of less than 5 nm produces a weak reinforcing effect while an average particle diameter in excess of 0.5 $\mu$m rather lowers the mechanical properties of resin.

The amount of inorganic filler to be added in this invention is in the range 0.01–5 parts by weight for every 100 parts by weight of the resin-forming component in the resin composition although it varies somewhat with the property of the filler in use. An amount of 0.01 part by weight or less produces a weak reinforcing effect while an amount of 5 parts by weight or more rather deteriorates the properties such as reliability of the resin composition. As the filler to be used in this invention is small in average particle diameter, it produces an anticipated effect even when it is added in a relatively small amount. Among the aforementioned amounts to be added, the range 0.1–1 part by weight is preferable.

In case an inorganic filler to be used in this invention contains a solvent as silica sol, the amount to be added refers to the solid content expressed in part by weight.

The average particle diameter and range of addition of the aforementioned inorganic filler being as described above, the most preferable procedure is to add 0.1–0.6 part by weight of the filler with its average particle diameter controlled in the range 5–30 nm to 100 parts by weight of the resin-forming component.

In case the aforementioned silica sol is used, the kind dispersed in an organic solvent may be used and dispersion media include methanol, ethylene glycol, propylene glycol monomethyl ether, ethylene glycol mono-n-propyl ether, methyl ethyl ketone, isopropanol and butyl acetate. A dispersion medium is not restricted in any specific way and it is selected adequately, for example, by using dispersibility of the filler in resin as criterion.

A photopolymerization initiator or sensitizer to be used in this invention or the component (C) is intended not only for the component (A) but also for a photopolymerizable (meth) acrylic monomer or oligomer to be incorporated as needed. The component (C) to be used for such a purpose includes known photopolymerization initiators such as radical-generating Michler's ketone and cation-generating triarylsulfonium salts and diaryliodonium salts and these initiators can be used singly or as a mixture of two kinds or more. The component (C) is not always necessary in case the resin composition is thermally polymerizable, but it gains importance when patterns are formed by such steps as exposure to light and development.

The aforementioned photopolymerization initiators can be used in combination with known photosensitizers such as ethyl N,N-dimethylaminobenzoate, isoamyl N,N-dimethylaminobenzoate, triethanolamine and triethylamine and the photosensitizers here may be used singly or as a mixture of two kinds or more.

The aforementioned photopolymerization initiator or sensitizer is used at a dombined proportion of 0–10 parts by weight, preferably 1–5 parts by weight, per 100 parts by weight of the resin-forming component. Use of more than 10 parts by weight increases light absorption and develops the possibility of light not penetrating to the lower region. In case the component (A) is used, the photopolymerization initiator or sensitizer in question is incorporated at a rate of 0.01–10 parts by weight, preferably 1–5 parts by weight, per 100 parts by weight of the component (A).

It is allowable to incorporate, together with the aforementioned essential components, additives such as curing accelerators for epoxy resins, polymerization inhibitors, plasticizers, leveling agents, and antifoaming agents in a photo- or heat-curable resin composition of this invention as needed. Such additives include the following compounds: amines, imidazoles, carboxylic acids, phenols, quaternary ammonium salts, and methylol group-containing compounds as curing accelerators for epoxy resins; hydroquinone, hydroquinone monomethyl ether, pyrogallol, tert-butylcatechol, and phenothiazine as thermal polymerization inhibitors; dibutyl phthalate, dioctyl phthalate, and tricresyl phosphate as plasticizers; and silicones, fluorine-containing compounds, and acrylic compounds as antifoaming agents and leveling agents.

Moreover, the viscosity of a photo- or heat-curable resin composition of this invention can be adjusted by incorporating a solvent as needed. A solvent for this use needs to be capable of dissolving the aforementioned matrix resin component and yet nonreactive with the resin in the matrix resin component and the additives and, as long as these conditions are satisfied, there are no other restrictions.

A photo- or heat-curable resin composition of this invention is formulated so that it comprises 99–80% by weight of the resin-forming component, 0.01–5% by weight of a filler, and 0.1–20% by weight of an initiator and other additives exclusive of a solvent and the viscosity is adjusted to the desired value by proper incorporation of a solvent.

Furthermore, it is possible to use a photo- or heat-curable resin composition of this invention in the form of dry film.

The method of forming a conductive layer on the surface of a layer of cured resin is not restricted. For example, a circuit is formed by applying a resin composition to the base material by spin coating or curtain coating, drying, exposing to light, developing and curing by heat. The surface of the cured resin is planarized by buffing as needed and a known dry plating process is applied. Then, a known process for electrolytic copper plating is applied to form a conductive layer.

A photo- or heat-curable resin composition of this invention is also used as a protective film on the surface of a wiring board or as a protective insulation layer of chips mounted on a wiring board.

EXAMPLES

Examples 1–3

[Preparation of Resin Compositions]

Photo- or heat-curable resin compositions of Examples 1 to 3 containing about 50% by weight of a resin as solid, exhibiting a viscosity of about 200 c.p. at 23° C., and differing in the amount of an inorganic filler were prepared as a dispersion at room temperature by mixing resin (A) or the compound represented by the general formula (1) wherein X is fluorene-9-ylidene and the following additives in accordance with the following recipe and adding an inorganic filler. The inorganic filler used here was silica sol with a particle diameter of 10–20 nm (Organosilica Sol NPC-ST available from Nissan Chemical Industries, Ltd.; content of silica, 30%) and it was incorporated at a rate of 0.25 part by weight as silica (or 0.83 part by weight as organosilica sol) in Example 1, 0.5 part by weight in Example 2, and 0.75 part by weight as silica (or 2.50 parts by weight as organosilica sol) in Example 3 per 98 parts by weight of the resin-forming component.

In the recipe, the tetramethylbiphenylepoxy resin was Epikote YX4000 available from Yuka Shell Epoxy K.K., the polyfunctional acrylate was KAYARAD TMPTA available from Nippon Kayaku Co., Ltd., the photopolymerization initiator was Irgacure 651 available from Ciba-Geigy, and the solvent was propylene glycol monomethyl ether acetate (PGMEA).

| [Recipe] | |
|---|---|
| Resin A | 30 parts by weight (60 g) |
| Tetramethylbiphenylepoxy resin | 6 parts by weight (12 g) |
| Polyfunctional acrylate | 13 parts by weight (26 g) |
| Sensitizer (Michler's ketone) | 0.04 part by weight (0.08 g) |
| Photopolymerization initiator | 1 part by weight (2 g) |
| Solvent | 50 parts by weight (100 g) |

Example 4

A photo- or heat-curable resin composition was prepared from 200 g of the aforementioned photo- or heat-curable resin composition (exclusive of the inorganic filler) by adding 0.5 part by weight of Organosilica Sol EG-ST-ZL (content of silica, 20%; particle diameter, 70 nm; available from Nissan Chemical Industries, Ltd.) as inorganic filler to 98 parts by weight of the resin-forming component.

Comparative Example 1

The aforementioned photo- or heat-curable resin composition less the inorganic filler was used as a comparative specimen.

Comparative Example 2

A photo- or heat-curable resin composition was prepared as in Example 1 except incorporating 10 parts by weight of the inorganic filler (Organosilica Sol NPC-ST) per 98 parts by weight of the resin-forming component.

Comparative Example 3

A photo- or heat-curable resin composition was prepared as in Example 1 except incorporating 20 parts by weight of the inorganic filler (Organosilica Sol NPC-ST) per 98 parts by weight of the resin-forming component.

Comparative Example 4

A photo- or heat-curable resin composition was prepared as in Example 1 except incorporating 0.5 part by weight of a filler with an average particle diameter of 2 $\mu$m [Poly(methyl methacrylate) Filler MX-180, available from Soken Kagaku K.K.) per 98 parts by weight of the resin-forming component.

The conditions for preparing a base material for evaluation are as follows.

On a commercially available FR-4 base material copper-clad on both sides (MCL-E-67 available from Hitachi Chemical Co., Ltd.: thickness of copper wiring, 18 $\mu$m) were formed 1350×4 dumbbell-shaped patterns and the surface of the copper was roughened by the Neobrown process of Ebara Densan K.K. to prepare a base material for evaluation.

The base material for evaluation was spin-coated with the aforementioned photo- or heat-curable resin composition to a thickness of 20 $\mu$m, dried at 110° C. for 10 minutes, photo-cured by irradiating with a 500-W high-pressure mercury lamp at 200 mj/cm$^2$ (i-line), developed by a developer (V-2590D, available from Nippon Steel Chemical Co., Ltd.), and post-cured in air at 180° C. for 90 minutes.

Method for Evaluating Reliability

The thermal shock test was conducted under the following conditions to evaluate reliability.

Each of the base materials for evaluation prepared under the aforementioned conditions was subjected to a test consisting of 250 cycles of immersion in a liquid at –65° C. for 5 minutes and then in another liquid at 125° C. for 5 minutes in a thermal shock tester, TSB-1L manufactured by TABAI ESPEC K.K., and the number of cracks on each base material was noted for comparison.

Reliability=[1–(number of cracks/number of toal patterns)]× 100(%)

Method for Evaluating Resolution

Resolution was assessed by determining the minimum width of line and space with which a circuit can be formed at a film thickness of 20 $\mu$m.

Method for Evaluating Heat Resistance

The glass transition temperature (Tg) was determined by a known dynamic viscoelastic method.

The results of evaluation of Examples and Comparative Examples are shown in Table 1.

TABLE 1

| | Content of inorganic filler Part by wt | Particle diameter of filler nm | Reliability % | Resolution μm | Tg °C. |
|---|---|---|---|---|---|
| Example 1 | 0.25 | 10–20 | 100 | 20 | 200 |
| Example 2 | 0.5 | 10–20 | 100 | 20 | 200 |
| Example 3 | 0.75 | 10–20 | 95 | 20 | 200 |
| Example 4 | 0.5 | 70 | 95 | 20 | 200 |
| Comp. ex. 1 | 0 | — | 20 | 20 | 200 |
| Comp. ex. 2 | 10 | 10–20 | 70 | 20 | 200 |
| Comp. ex. 3 | 20 | 10–20 | 0 | 20 | 200 |
| Comp. ex. 4 | 0.5 | 2000 | 0 | 20 | 200 |

As is apparent from the aforementioned results of Examples 1 to 4 and Comparative Examples 1 to 4, dispersing a small amount of a fine inorganic filler produces good resistance to cracking. In addition, both high glass transition temperature and high resolution are obtained.

Photo- or heat-curable resin compositions of this invention cure into resins with minimal cracking and high reliability. Properly selected resins help to yield resin compositions of good heat resistance due to high glass transition temperature and good microfabrication quality and such resin compositions are useful for forming peripheral materials of electronic parts such as semiconductor devices by the build-up process, for example, insulation layers in multilayer printed wiring boards and WL-CSP.

What is claimed is:

1. A photo- or heat-curable resin composition for forming a resin insulation layer in a printed wiring board comprising a resin-forming component and 0.1 to 1 parts by weight of silica sol with an average particle diameter in the range of 5 nm–0.5 μm per 100 parts by weight of the resin-forming component wherein the resin-forming component comprises:

(A) 100 parts by weight of a photopolymerizable unsaturated compound represented by the following general formula (1)

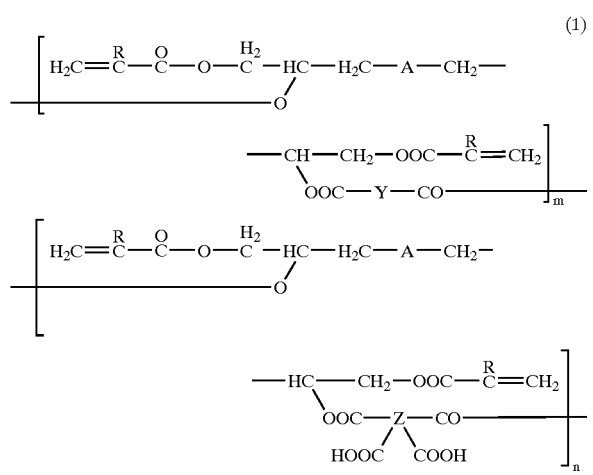

(1)

wherein R is a hydrogen atom or a methyl group, A is a group represented by the formula (2)

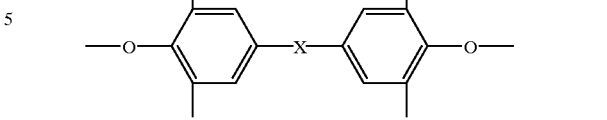

(2)

(wherein $R_1$ and $R_2$ are independently hydrogen, an alkyl group with 1–5 carbon atoms, or a halogen), X is —CO—, —SO$_2$—, —C(CF$_3$)$_2$—, —Si(CH$_3$)$_2$—, —CH$_2$—, —O—, —S—,

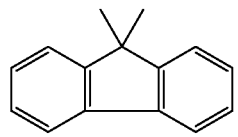

or a direct bond, Y and Z are respectively the residue of a polycarboxylic acid or its acid anhydride, and m and n are the number of repeating units at a molar ratio m/n 0/100–100/0, (B) 0–50 parts by weight of a compound containing an epoxy group, (C) 0–10 parts by weight of a photopolymerization initiator or sensitizer.

2. A multilayer printed wiring board wherein a resin insulation layer is formed by the cured product of a photo- or heat-curable resin composition as described in claim 1.

3. A photo- or heat-curable resin composition comprising:

(A) 30 to 80 parts by weight of a photopolymerizable unsaturated compound; compound of formula (1)

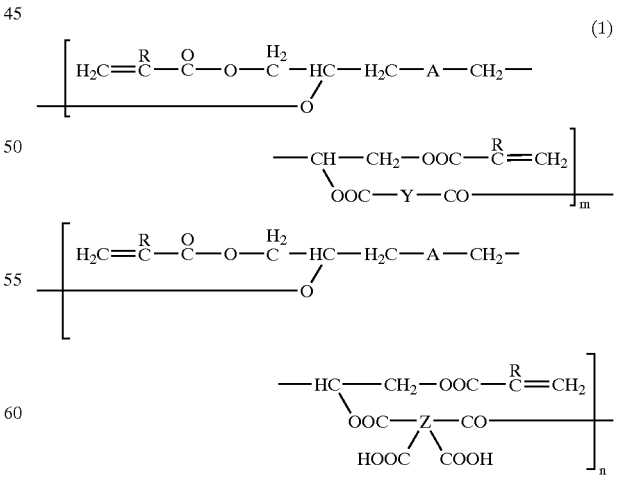

(1)

wherein R is a hydrogen atom or a methyl group, A is a group represented by the formula (2)

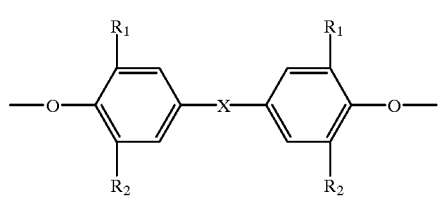

(wherein $R_1$ and $R_2$ are independently hydrogen, an alkyl group with 1–5 carbon atoms, or a halogen), X is —CO—, —SO$_2$—, —C(CF$_3$)$_2$—, —Si(CH$_3$)$_2$—, —CH$_2$—, —O—, —S—,

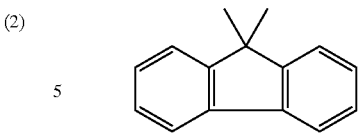

or a direct bond, Y and Z are respectively the residue of a polycarboxylic acid or its acid anhydride, and m and n are the number of repeating units at a molar ratio m/n 0/100–100/0;

(B) 10 to 50 parts by weight of a compound containing an epoxy group;
(C) 10 to 40 parts by weight of a polyfunctional acrylate; and
(D) 0.1 to 1 part by weight of silica aol having an average particle diameter in the range of 10 to 100 nm.

* * * * *